United States Patent
Kitagawa

(10) Patent No.: US 8,710,542 B2
(45) Date of Patent: Apr. 29, 2014

(54) SEMICONDUCTOR DEVICE

(75) Inventor: Mitsuhiko Kitagawa, Tokyo (JP)

(73) Assignee: Kabushiki Kaisha Tosiba, Tokyo (JP)

( * ) Notice: Subject to any disclaimer, the term of this patent is extended or adjusted under 35 U.S.C. 154(b) by 0 days.

(21) Appl. No.: 13/238,627

(22) Filed: Sep. 21, 2011

(65) Prior Publication Data

US 2012/0068221 A1    Mar. 22, 2012

(30) Foreign Application Priority Data

Sep. 21, 2010   (JP) ................................. 2010-210563
Jul. 15, 2011   (JP) ................................. 2011-156986

(51) Int. Cl.
*H01L 29/66*    (2006.01)

(52) U.S. Cl.
USPC ............ 257/133; 257/106; 257/109; 257/653; 257/654; 257/655; 257/E29.027; 257/E29.066; 257/E29.197; 257/E29.201

(58) Field of Classification Search
USPC ......... 257/106, 109, 653, 654, 655, 656, 133, 257/E29.027, E29.066, E29.197, E29.201, 257/382
See application file for complete search history.

(56) References Cited

U.S. PATENT DOCUMENTS

| 6,867,437 B2 * | 3/2005 | Takahashi et al. ............. 257/136 |
| 2009/0278167 A1 * | 11/2009 | Ozoe .............................. 257/139 |

FOREIGN PATENT DOCUMENTS

JP    2009-188336    8/2009

OTHER PUBLICATIONS

Chinese Office Action dated Nov. 27, 2013, filed in Chinese counterpart Application No. 201110274284.X, 12 pages (with translation).

* cited by examiner

*Primary Examiner* — Kyoung Lee
*Assistant Examiner* — Ratisha Mehta
(74) *Attorney, Agent, or Firm* — Patterson & Sheridan, LLP

(57) ABSTRACT

A semiconductor device includes a base layer, a second conductivity type semiconductor layer, a first insulating film, and a first electrode. The first insulating film is provided on an inner wall of a plurality of first trenches extending from a surface of the second conductivity type semiconductor layer toward the base layer side, but not reaching the base layer. The first electrode is provided in the first trench via the first insulating film, and provided in contact with a surface of the second conductivity type semiconductor layer. The second conductivity type semiconductor layer includes first and second regions. The first region is provided between the first trenches. The second region is provided between the first second conductivity type region and the base layer, and between a bottom part of the first trench and the base layer. The second region has less second conductivity type impurities than the first region.

11 Claims, 10 Drawing Sheets

SEMICONDUCTOR DEVICE

CROSS-REFERENCE TO RELATED APPLICATIONS

This application is based upon and claims the benefit of priority from Japanese Patent Application No.2010-210563, filed on Sep. 21, 2010 and Japanese Patent Application No.2011-156986, filed on Jul. 15, 2011; the entire contents of all of which are incorporated herein by reference.

FIELD

Embodiments described herein relate generally to a semiconductor device.

BACKGROUND

In bipolar devices, carriers injected into a base layer (or drift layer) in an ON state do not directly disappear immediately after turnoff. In the case of diodes, a current in an opposite direction may flow, and, in the case of insulated gate bipolar transistors (IGBTs) or thyristors, a tail current may flow. This causes power loss (switching loss).

DETAILED DESCRIPTION

Figures 1A, 1B:
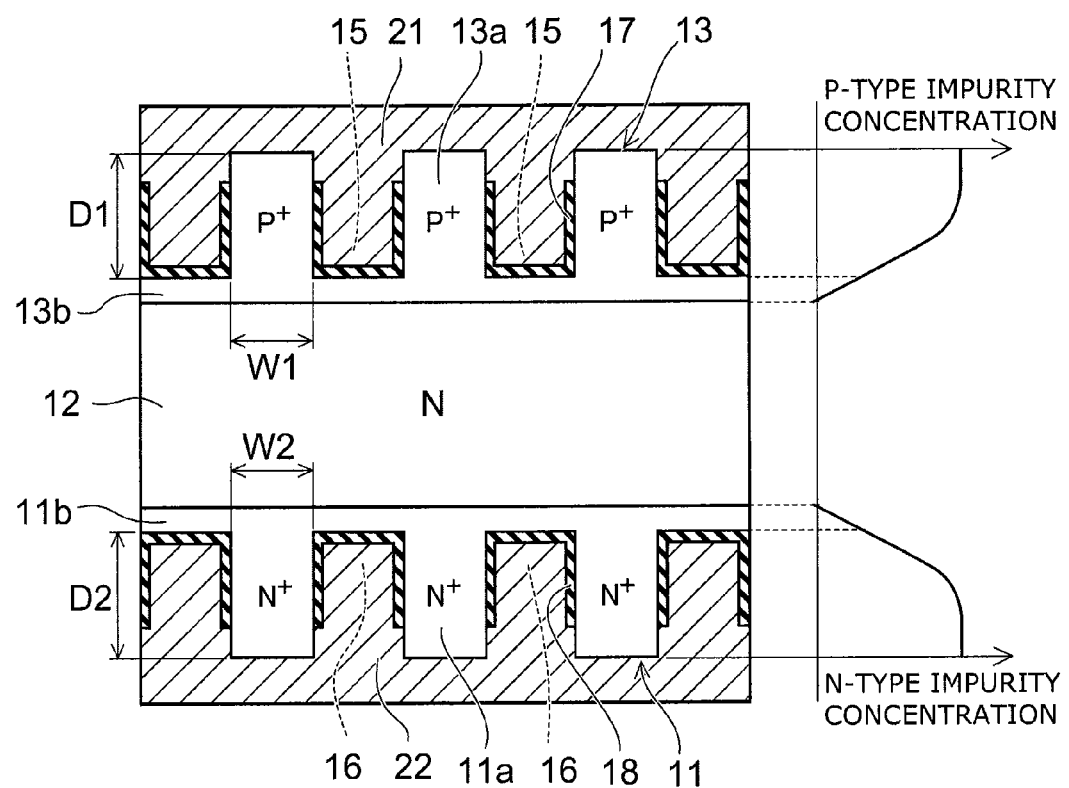
FIG. 1A is a schematic cross-sectional view of a semiconductor device in a first embodiment.
FIG. 1B is a distribution chart illustrating an impurity concentration of the semiconductor device.

According to one embodiment, a semiconductor device includes a base layer, a second conductivity type semiconductor layer, a first insulating film, and a first electrode. The second conductivity type semiconductor layer is provided on the base layer. The first insulating film is provided on an inner wall of a plurality of first trenches extending from a surface of the second conductivity type semiconductor layer toward the base layer side, but not reaching the base layer. The first electrode is provided in the first trench via the first insulating film, and provided in contact with a surface of the second conductivity type semiconductor layer. The second conductivity type semiconductor layer includes a first second conductivity type region, and a second second conductivity type region. The first second conductivity type region is provided between the first trenches. The second second conductivity type region is provided between the first second conductivity type region and the base layer, and between a bottom part of the first trench and the base layer. The second second conductivity type region is smaller in a quantity of second conductivity type impurities than the first second conductivity type region.

Hereinafter, embodiments will be explained with reference to the drawings. In the explanation of embodiments below, a first conductivity type is defined as an n-type and a second conductivity type is defined as a p-type, but the first conductivity type may be defined as a p-type and the second conductivity type may be defined as an n-type. Furthermore, as a semiconductor, silicon is exemplified, but semiconductors other than silicon (for example, compound semiconductors such as SiC, GaN, etc.) may be used. In respective drawings, the same reference numeral is given to the same device.

First Embodiment

FIG. 1A is a schematic cross-sectional view of the semiconductor device of a first embodiment.

The semiconductor device of the embodiment is a vertical device, in which a major current path is formed in a vertical direction connecting between a first electrode 21 provided on a major surface side in a semiconductor layer (or substrate) and a second electrode 22 provided on the other major surface side. In the embodiment, a direction approximately parallel to the major surface of the semiconductor layer (or substrate) is defined as a horizontal direction.

The semiconductor device according to the embodiment has a diode structure provided with an n-type semiconductor layer 11, an n-type base layer 12 and a p-type semiconductor layer 13, between the first electrode 21 and the second electrode 22.

The base layer 12 is provided on the n-type semiconductor layer 11. The p-type semiconductor layer 13 is provided on the base layer 12. The n-type semiconductor layer 11 is provided on a side opposite to the face on which the p-type semiconductor layer 13 is provided in the base layer 12. The p-type semiconductor layer 13 and the n-type base layer 12 are in a PN-junction state.

In the p-type semiconductor layer 13, a plurality of first trenches 15 are formed. The first trench 15 extends from the surface of the p-type semiconductor layer 13 toward the base layer 12 side, but does not reach the base layer 12. That is, the bottom part of the first trench 15 is located on the p-type semiconductor layer 13 side from the PN-junction of the p-type semiconductor layer 13 and the base layer 12. Between the bottom part of the first trench 15 and the base layer 12, the p-type semiconductor layer 13 exists. The first trench 15 is formed by a planar pattern of a stripe form extending, for example, in the perspective direction of the paper.

On the inner wall (side wall and bottom part) of the first trench 15, a first insulating film 17 is formed. In the first trench 15, a first electrode 21 is provided via the first insulating film 17. The first electrode 21 is buried in the first trench 15, and is also provided on the surface of the p-type semiconductor layer 13. The first electrode 21 is in ohmic contact with the surface of the p-type semiconductor layer 13 to be connected electrically.

In the n-type semiconductor layer 11, a plurality of second trenches 16 are formed. The second trench 16 extends from the surface of the n-type semiconductor layer 11 toward the base layer 12 side, but does not reach the base layer 12. That is, the bottom part of the second trench 16 is located in the n-type semiconductor layer 11. Between the bottom part of the second trench 16 and the base layer 12, the n-type semiconductor layer 11 exists. The second trench 16 is formed by a planar pattern of a stripe form extending, for example, in the perspective direction of the paper.

On the inner wall (side wall and bottom part) of the second trench 16, a second insulating film 18 is formed. In the second trench 16, a second electrode 22 is provided via the second insulating film 18. The second electrode 22 is buried in the second trench 16, and is also provided on the surface of the n-type semiconductor layer 11. The second electrode 22 is in ohmic contact with the surface of the n-type semiconductor layer 11 to be connected electrically.

The p-type semiconductor layer 13 has a first p-type region 13a and a second p-type region 13b. The first p-type region 13a is sandwiched between first trenches 15 adjacent in a lateral direction. The second p-type region 13b exists between the first p-type region 13a and the base layer 12, and between the bottom part of the first trench 15 and the base layer 12. Between the second p-type region 13b and the first electrode 21, the first insulating film 17 is provided, and the second p-type region 13b does not contact the first electrode 21.

The n-type semiconductor layer 11 has a first n-type region 11a and a second n-type region 11b. The first n-type region 11a is sandwiched between second trenches 16 adjacent in a lateral direction. The second n-type region 11b exists between the first n-type region 11a and the base layer 12, and between the bottom part of the second trench 16 and the base layer 12. Between the second n-type region 11b and the second electrode 22, the second insulating film 18 is provided, and the second n-type region 11b does not contact the second electrode 22.

Here, FIG. 1B shows the distribution of p-type impurity concentration (atoms/cm$^3$) in the longitudinal direction (depth direction) of the p-type semiconductor layer 13, and the distribution of n-type impurity concentration (atoms/cm$^3$) in the longitudinal direction (depth direction) of the n-type semiconductor layer 11.

The p-type impurity concentration in the second p-type region 13b is lower than the p-type impurity concentration in the first p-type region 13a. The peak value of the p-type impurity concentration in the second p-type region 13b is smaller than the peak value of the p-type impurity concentration in the first p-type region 13a.

From the viewpoint of suppressing the injection efficiency of holes, for example, the peak value of the p-type impurities in the second p-type region 13b is desirably not more than $5 \times 10^{16}$ (atoms/cm$^3$). Furthermore, the dose quantity of the p-type impurity in the second p-type region 13b is, for example for a high-speed switching type etc., desirably not more than $10^{12}$ (atoms/cm$^2$). An actual dose quantity of the p-type impurities varies according to specific products.

The peak value of the P-type impurity concentration in the first p-type region 13a is $10^{19}$ (atoms/cm$^3$). Moreover, the thickness of the second p-type region 13b is thinner than the thickness D1 of the first p-type region 13a (depth of the first trench 15). And, the p-type impurity quantity contained in the whole second p-type region 13b is smaller than the p-type impurity quantity contained in the whole first p-type region 13a.

The n-type impurity concentration in the second n-type region 11b is lower than the n-type impurity concentration in the first n-type region 11a. The peak value of the n-type impurity concentration in the second n-type region 11b is smaller than the peak value of the n-type impurity concentration in the first n-type region 11a.

From the viewpoint of suppressing the injection efficiency of electrons, for example, the peak value of the n-type impurities in the second n-type region 11b is desirably not more than $5 \times 10^{16}$ (atoms/cm$^3$). Furthermore, the dose quantity of the n-type impurities in the second n-type region 11b is, for example for a high-speed switching type etc., desirably not more than $10^{12}$ (atoms/cm$^2$). An actual dose quantity of the n-type impurities varies according to specific products.

The peak value of the n-type impurity concentration in the first n-type region 11a is $10^{19}$ (atoms/cm$^3$). Moreover, the thickness of the second n-type region 11b is thinner than the thickness D2 of the first n-type region 11a (depth of the second trench 16). And, the n-type impurity quantity contained in the whole second n-type region 11b is smaller than the n-type impurity quantity contained in the whole first n-type region 11a.

The n-type impurity concentration in the base layer 12 is lower than the n-type impurity concentration in the first n-type region 11a of the n-type semiconductor layer 11.

When the first electrode 21 is set as a higher potential relative to the second electrode 22 and the forward voltage (forward bias) is applied between the first electrode 21 and the second electrode 22, the state is turned ON. On the contrary, when the second electrode 22 is set as a higher potential relative to the first electrode 21 and the backward voltage (backward bias) is applied between the first electrode 21 and the second electrode 22, the state is turned OFF.

For example, when positive potential is given to the first electrode 21 and 0 volt or negative potential is given to the second electrode 22 to thereby apply forward voltage between the first electrode 21 and the second electrode 22, holes are injected into the base layer 12 from the p-type semiconductor layer 13 and electrons are injected into the base layer 12 from the n-type semiconductor layer 11, and a forward current flows in the longitudinal direction between the first electrode 21 and the second electrode 22.

The first electrode 21 contacts the first p-type region 13a having a relatively high p-type impurity concentration. Consequently, good ohmic contact of the first electrode 21 with the first p-type region 13a can be obtained.

In contrast, the second p-type region 13b on the base layer 12 side has a relatively low p-type impurity concentration, and contains p-type impurities in a small quantity.

Furthermore, the first p-type region 13a is sandwiched by first trenches 15, and, in the first trench 15 and on the first p-type region 13a, the first electrode 21 is provided. That is, the upper face and the side face of the first p-type region 13a are surrounded by the first electrode 21.

In such a structure, by setting the interval between first trenches 15, or width W1 of the first p-type region 13a to be minute, it is possible to cause the potential of the first electrode 21 to influence the whole in the width direction in the first p-type region 13a. That is, it is possible to cause the potential of the first electrode 21 to also influence the edge part on the base layer 12 side in the first p-type region 13a. Accordingly, no potential difference is generated in the longitudinal direction of the first p-type region 13a, or the potential difference in the longitudinal direction is very small.

Consequently, in an ON state in which the forward bias is applied, the transfer of holes in the longitudinal direction in the first p-type region 13a is regulated, and holes are scarcely injected into the base layer 12 from the first p-type region 13a. Alternatively, holes injected into the base layer 12 from the first p-type region 13a are very few.

Accordingly, when the state is ON, holes are injected into the base layer 12 from the second p-type region 13b. The second p-type region 13b contains a smaller quantity of p-type impurities as compared with the first p-type region 13a. Consequently, it is possible to lower the injection efficiency of holes into the base layer 12, and to decrease holes remaining in the base layer 12 immediately after turnoff. As the result, it is possible to reduce a backward current at the time of the turnoff, and to reduce switching loss.

A technology is known in which a defect functioning as a recombination center for a hole is induced by introducing a lifetime killer such as a proton into the base layer 12 to thereby control the lifetime of a hole injected into the base layer 12. However, the introduction of the lifetime killer leads to the increase in a leakage current in an OFF state.

In the embodiment, turnoff properties are improved by the control of impurity quantity in the p-type semiconductor layer 13 and the geometric structure obtained by forming the first trench 15, without introducing a lifetime killer into the base layer 12. Accordingly, as compared with the case where the lifetime is controlled by the lifetime killer, the leakage current in an OFF state can be decreased. The leakage current depends on temperatures, and the leakage current is apt to increase with the rise of temperature. In the embodiment, since the leakage current can be reduced, operations at higher temperatures are possible.

When the interval between first trenches 15, or the width W1 of the first p-type region 13a is large, it becomes difficult to cause the potential of the first electrode 21 to influence the whole in the width direction in the first p-type region 13a. Accordingly, the width W1 of the first p-type region 13a is desirably not more than 1 (μm).

The second electrode 22 contacts the first n-type region 11a having a relatively high n-type impurity concentration. Consequently, good ohmic contact of the second electrode 22 with the first n-type region 11a can be obtained.

In contrast, the second n-type region 11b on the base layer 12 side has a relatively low n-type impurity concentration, and contains n-type impurities in a small quantity.

Furthermore, the first n-type region 11a is sandwiched by second trenches 16, and, in the second trench 16 and on the first n-type region 11a, the second electrode 22 is provided. That is, the upper face and the side face of the first n-type region 11a are surrounded by the second electrode 22.

In such a structure, by setting the interval between second trenches 16, or width W2 of the first n-type region 11a to be minute, it is possible to cause the potential of the second electrode 22 to influence the whole in the width direction in the first n-type region 11a. That is, it is possible to cause the potential of the second electrode 22 to also influence the edge part on the base layer 12 side in the first n-type region 11a. Accordingly, no potential difference is generated in the longitudinal direction of the first n-type region 11a, or the potential difference in the longitudinal direction is very small.

Consequently, in an ON state in which the forward bias is applied, the transfer of electrons in the longitudinal direction in the first n-type region 11a is regulated, and electrons are scarcely injected into the base layer 12 from the first n-type region 11a. Alternatively, electrons injected into the base layer 12 from the first n-type region 11a are very few.

Accordingly, when the state is ON, electrons are injected into the base layer 12 from the second n-type region 11b. The second n-type region 11b contains a smaller quantity of n-type impurities as compared with the first n-type region 11a. Consequently, it is possible to lower the injection efficiency of electrons into the base layer 12, and to decrease electrons remaining in the base layer 12 immediately after turnoff. As the result, it is possible to reduce the backward current at the time of the turnoff, and to reduce switching loss.

Moreover, in the embodiment, turnoff properties are improved by the control of impurity quantity in the n-type semiconductor layer 11 and the geometric structure obtained by forming the second trench 16, without introducing a lifetime killer into the base layer 12. Accordingly, as compared with the case where the lifetime is controlled by the lifetime killer, the leakage current in an OFF state can be decreased. The leakage current depends on temperatures, and the leakage current is apt to increase with the rise of temperature. In the embodiment, since the leakage current can be reduced, operations at higher temperatures are possible.

When the interval between second trenches 16, or the width W2 of the first n-type region 11a is large, it becomes difficult to cause the potential of the second electrode 22 to influence the whole in the width direction in the first n-type region 11a. Accordingly, the width W2 of the first n-type region 11a is desirably not more than 1 (μm).

Figure 2:
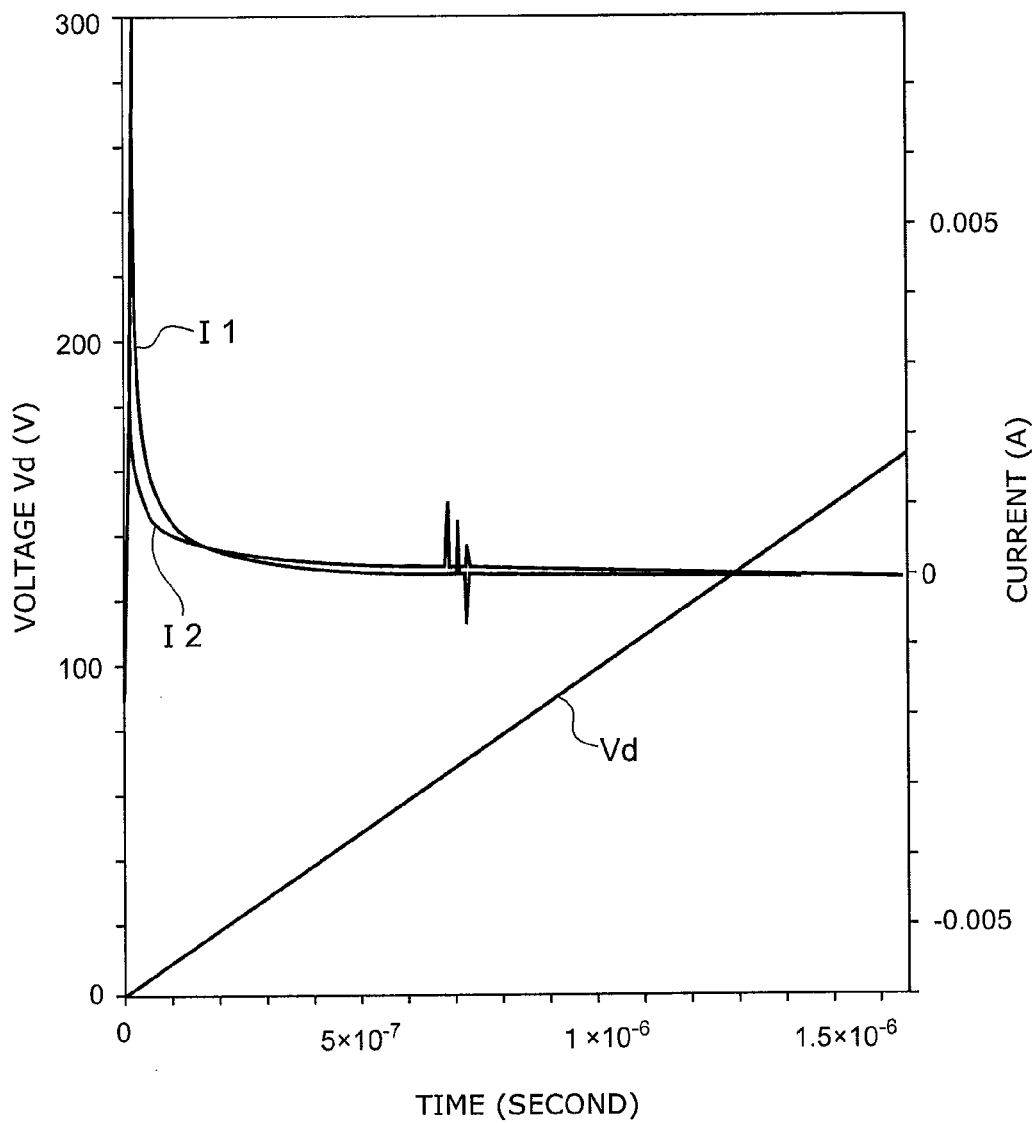
FIG. 2 is a characteristic chart of turnoff current.

FIG. 2 shows the result of simulation analysis of turnoff current properties. The horizontal axis shows time period (second), the left vertical axis shows the backward voltage Vd (V), and the right vertical axis shows the current (A).

Current I1 shows the turnoff current for a device of a Comparative example. The device of the Comparative example is a device that is not provided with trenches 15 and 16 and insulating layers 17 and 18 in the structure of the aforementioned embodiment, and that has an approximately uniform distribution of respective impurity concentrations in the longitudinal direction in the p-type semiconductor layer 13 and the n-type semiconductor layer 11. Furthermore, in the device of the Comparative example, a lifetime killer was introduced into the base layer 12 to thereby control the lifetime of carriers.

Current I2 represents the turnoff current of the device having the above-mentioned structure of the embodiment. In the structure, the interval between first trenches 15, or the width W1 of the first p-type region 13a was designed to be 1 (μm). The interval between second trenches 16, or the width W2 of the second n-type region 11a was designed to be 1 (μm).

From the result in FIG. 2, the peak value of the turnoff current I2 of the embodiment is about ⅜ the peak value of the turnoff current I1 of the Comparative example. Accordingly, the embodiment gives less power loss than the Comparative example at the time of the turnoff.

Figure 3A:
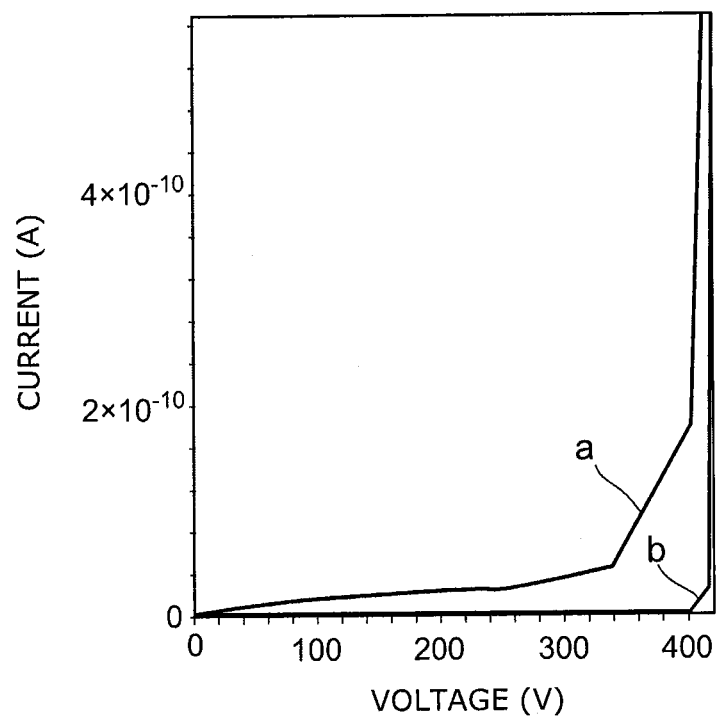
FIGS. 3A and 3B are current-voltage characteristic charts with applying the backward bias.
Figure 3B:
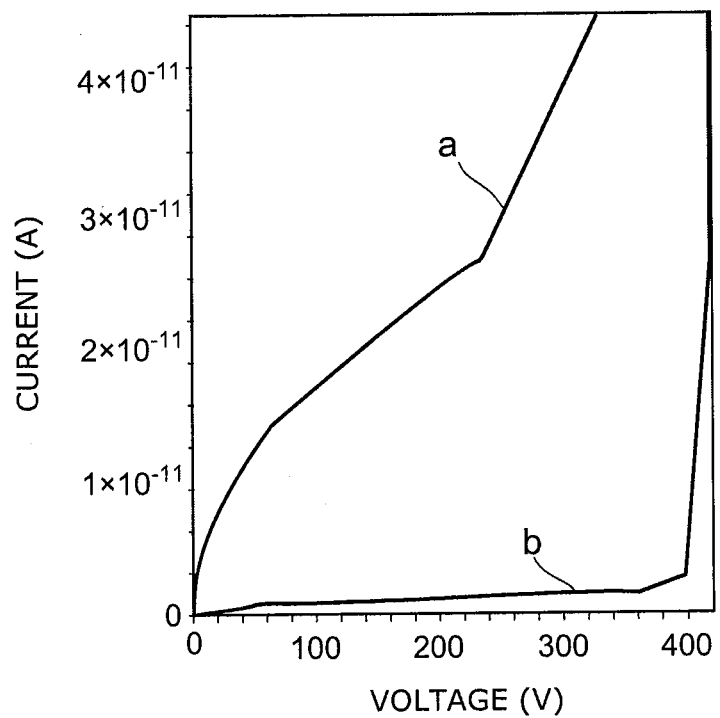

FIG. 3A shows the result of simulation analysis, in which current-voltage properties when the backward voltage is applied are compared between the aforementioned device of the Comparative example and device of the embodiment. The horizontal axis shows the backward voltage (V), and the vertical axis shows the current (A). FIG. 3B shows an enlarged view of a certain region in the graph in FIG. 3A. "a" shows current-voltage properties in the case of Comparative example, and "b" shows current-voltage properties in the case of the embodiment.

From results of FIGS. 3A and 3B, the embodiment gives a smaller leakage current in the backward bias than the Comparative example. For example, at 300 (V), the leakage current of the embodiment is about 1/200 the leakage current of the Comparative example.

Figure 4:
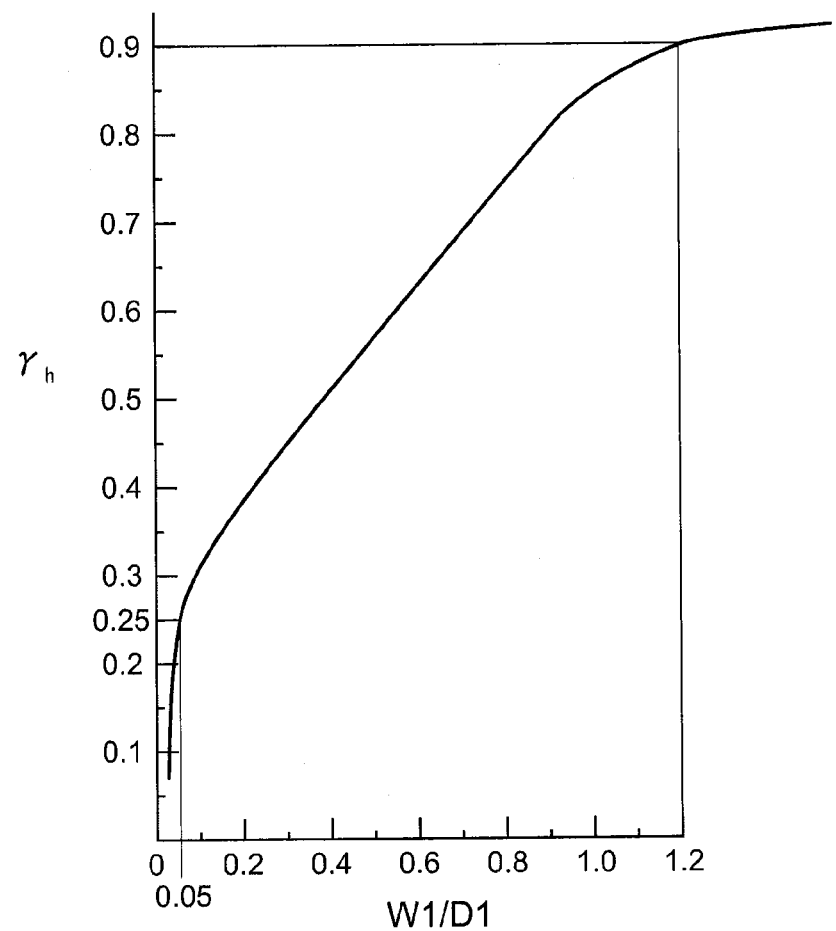
FIG. 4 is a simulation result of injection efficiency of holes.

FIG. 4 shows the simulation result of injection efficiency of holes in the semiconductor device according to the embodiment.

The horizontal axis shows the ratio (W1/D1) of the interval W1 between first trenches 15 relative to the depth D1 of the first trench 15.

The vertical axis shows an injection efficiency yh of holes represented by $\gamma h = Jh/(Jh+Jn)$. Jh is a hole current flowing from the p-type semiconductor layer 13 to the base layer 12 in an ON state, and Jn represents an electron current flowing from the base layer 12 to the p-type semiconductor layer 13 in the ON state.

Such knowledge is obtained that, when $0.25<\gamma h<0.9$, a sufficient forward current is obtained in an ON state and the backward current at the time of the turnoff can be suppressed. Accordingly, it is desirable that the design is made such that W1/D1 falls within $0.05<W1/D1<1.2$.

Figure 5:
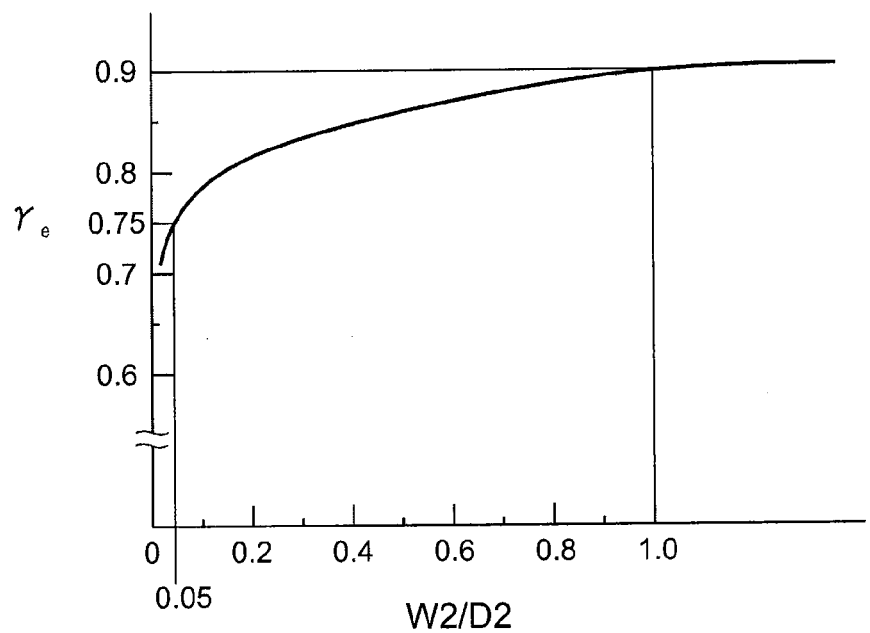
FIG. 5 is a simulation result of injection efficiency of electrons.

FIG. 5 shows the simulation result of the injection efficiency of electrons in the semiconductor device according to the embodiment.

The horizontal axis shows the ratio (W2/D2) of the interval W2 between second trenches 16 relative to the depth D2 of the second trench 16.

The vertical axis shows the injection efficiency γe of electrons represented by γe=Je/(Jp+Je). Je is an electron current flowing from the n-type semiconductor layer 11 to the base layer 12 in an ON state, and Jp represents a hole current flowing from the base layer 12 to the n-type semiconductor layer 11 in the ON state.

Such knowledge is obtained that, when $0.75<\gamma e<0.9$, a sufficient forward current is obtained in an ON state and the backward current at the time of the turnoff can be suppressed. Accordingly, it is desirable that the design is made such that W2/D2 falls within $0.05<W2/D2<1$.

When the backward voltage is applied between the first electrode 21 and the second electrode 22, a depletion layer spreads from the PN-junction of the p-type semiconductor layer 13 and the base layer 12. At this time, since the width W1 of the first p-type region 13a sandwiched by first trenches 15 is narrow, or the aspect ratio (ratio of thickness D1 relative to width W1) is large, the depletion layer is pinched off in the first p-type region 13a. Furthermore, since the first p-type region 13a contains impurities in a relatively high concentration, the extension of the depletion layer in the first p-type region 13a is suppressed. Consequently, the depletion layer does not reach the first electrode 21.

Moreover, since the width W2 of the first n-type region 11a sandwiched by second trenches 16 is narrow, or the aspect ratio (ratio of thickness D2 relative to width W2) is large, the depletion layer is pinched off in the first n-type region 11a. Furthermore, since the first n-type region 11a contains impurities in a relatively high concentration, the extension of the depletion layer in the first n-type region 11a is suppressed. Consequently, the depletion layer does not reach the second electrode 22. This enables a high breakdown voltage to be realized in an OFF state.

The P-type semiconductor layer 13 can be formed by introducing P-type impurities on one major surface side of the base layer 12 by, for example, an ion implantation method.

Prior to the formation of the first trench 15, p-type impurities are introduced on one surface side of the base layer 12 to thereby form the p-type semiconductor layer 13 having the impurity concentration distribution shown in FIG. 1B. The concentration of impurities is set to be relatively low in the vicinity of the boundary of the p-type semiconductor layer 13 and the base layer 12 in the entire surface direction.

After that, the first trench 15 is formed by, for example, a reactive ion etching (RIE) method. Then, the first insulating film 17 is formed on the bottom part and side wall of the first trench 15, and the first electrode 21 is buried in the first trench 15.

Alternatively, p-type impurities may be implanted after forming the first trench 15 on one surface side of the base layer 12. In this case, the concentration of impurities is set to be relatively high in a part sandwiched by first trenches 15. In the ion implantation for forming the region of a high impurity concentration, the bottom part of the first trench 15 is covered with a mask. The concentration of impurities is set to be relatively low in a part lower than the bottom part of the first trench 15. In the ion implantation for forming the region of low impurity concentration, the upper face of the part sandwiched by first trenches 15 is covered with a mask.

In the same manner, the n-type semiconductor layer 11 can be formed by introducing n-type impurities on the other major surface side of the base layer 12 by an ion implantation method.

Prior to the formation of the second trench 16, n-type impurities are introduced on the other surface side of the base layer 12 to thereby form the n-type semiconductor layer 11 having the impurity concentration distribution shown in FIG. 1B. The concentration of impurities is set to be relatively low in the vicinity of the boundary of the N-type semiconductor layer 11 and the base layer 12 in the entire surface direction.

After that, the second trench 16 is formed by, for example, an RIE method. Then, the second insulating film 18 is formed on the bottom part and side wall of the second trench 16, and the second electrode 22 is buried in the second trench 16.

Alternatively, n-type impurities may be implanted after forming the second trench 16 on the other surface side of the base layer 12. In this case, the concentration of impurities is set to be relatively high in a part sandwiched by second trenches 16. In the ion implantation for forming the region of a high impurity concentration, the bottom part of the second trench 16 is covered with a mask. The concentration of impurities is set to be relatively low in a part lower than the bottom part of the second trench 16. In the ion implantation for forming the region of low impurity concentration, the upper face of the part sandwiched by second trenches 16 is covered with a mask.

Second Embodiment

Figure 6A:
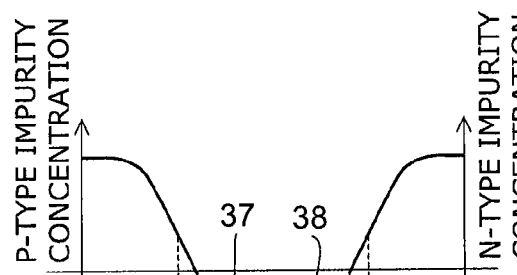
FIGS. 6A to 6E are schematic views of a semiconductor device in a second embodiment.
Figure 6B:
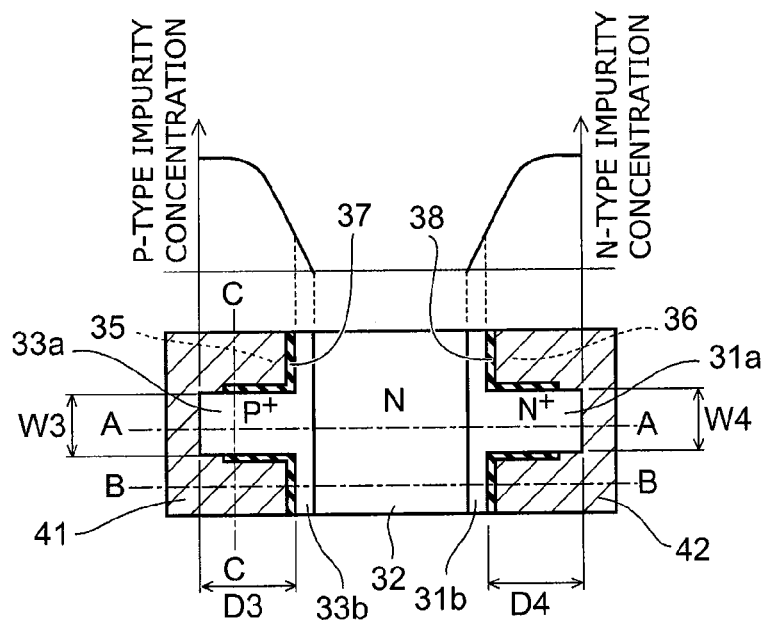

FIG. 6B is a schematic plan view of the semiconductor device of a second embodiment. A device shown in FIG. 6B is repeatedly formed in a plurality of numbers in the direction vertical to the paper.

Figure 6C:
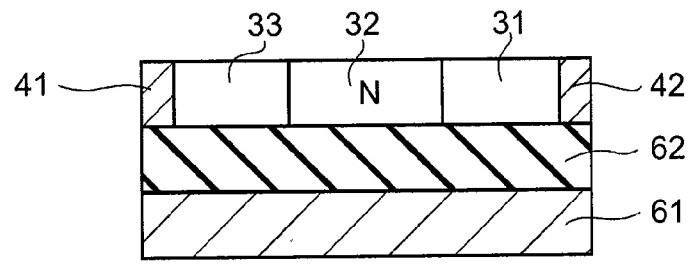
Figure 6D:
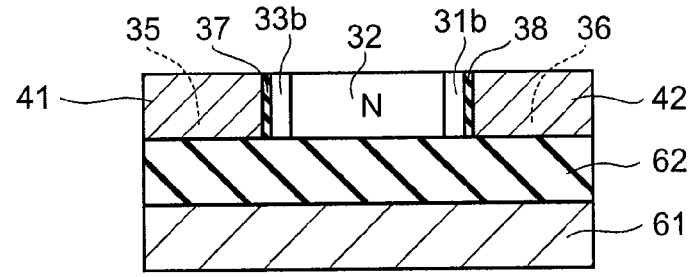
Figure 6E:
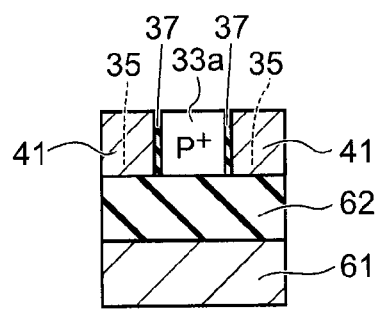

FIG. 6C is an A-A cross-sectional view in FIG. 6B.
FIG. 6D is a B-B cross-sectional view in FIG. 6B.
FIG. 6E is a C-C cross-sectional view in FIG. 6B.

The semiconductor device of the second embodiment has an SOI (Silicon On Insulator) structure provided with a semiconductor layer on a semiconductor layer (or substrate) 61 via an insulating layer 62. The insulating layer 62 is, for example, a silicon oxide layer. On the insulating layer 62, a first electrode 41 and a second electrode 42 are provided. The semiconductor device of the second embodiment is a horizontal device, in which a major current path is formed in the horizontal direction connecting between these first electrode 41 and second electrode 42.

Between the first electrode 41 and the second electrode 42, a diode structure including an n-type semiconductor layer 31, an n-type base layer 32, and a p-type semiconductor layer 33 is provided.

The n-type semiconductor layer 31, the base layer 32 and the p-type semiconductor layer 33 are provided on the insulating layer 62. The base layer 32 and the p-type semiconductor layer 33 are adjacent to each other on the insulating layer 62, and are in a PN-junction state. The n-type semiconductor layer 31 is adjacent to the base layer 32 on the side opposite to the p-type semiconductor layer 33.

In the p-type semiconductor layer 33, a plurality of first trenches 35 are formed. The first trench 35 reaches the insulating layer 62 from the surface of the p-type semiconductor layer 33. The first trench 35 also extends from the edge part of the p-type semiconductor layer 33 toward the base layer 32 side, but does not reach the base layer 32. The edge part of the first trench 35 on the base layer 32 side is located on the p-type semiconductor layer 33 side from the PN-junction of the p-type semiconductor layer 33 and the base layer 32.

On the side wall of the first trench 35, a first insulating film 37 is formed. In the first trench 35, a first electrode 41 is provided via the first insulating film 37. The first electrode 41 is buried in the first trench 35, and is also provided at the edge part of the p-type semiconductor layer 33. The first electrode 41 is in ohmic contact with the edge part of the p-type semiconductor layer 33 to be connected electrically.

In the n-type semiconductor layer 31, a plurality of second trenches 36 are formed. The second trench 36 reaches the insulating layer 62 from the surface of the n-type semiconductor layer 31. The second trench 36 extends from the edge part of the n-type semiconductor layer 31 toward the base layer 32 side, but does not reach the base layer 32. The edge part of the second trench 36 on the base layer 32 side exists in the n-type semiconductor layer 31.

On the side wall of the second trench 36, a second insulating film 38 is formed. In the second trench 36, a second electrode 42 is provided via the second insulating film 38. The second electrode 42 is buried in the second trench 36, and is also provided at the edge part of the n-type semiconductor layer 31. The second electrode 42 is in ohmic contact with the edge part of the n-type semiconductor layer 31 to be connected electrically.

The p-type semiconductor layer 33 has a first p-type region 33a and a second p-type region 33b. The first p-type region 33a is sandwiched between adjacent first trenches 35. The second p-type region 33b exists between the first p-type region 33a and the base layer 32, and between the edge part of the first trench 35 on the base layer 32 side and the base layer 32.

The n-type semiconductor layer 31 has a first n-type region 31a and a second n-type region 31b. The first n-type region 31a is sandwiched between adjacent second trenches 36. The second n-type region 31b exists between the first n-type region 31a and the base layer 32, and between the edge part of the second trench 36 on the base layer 32 side and the base layer 32.

Here, FIG. 6A shows the distribution of p-type impurity concentration (atoms/cm$^3$) in the lateral direction in the p-type semiconductor layer 33, and the distribution of n-type impurity concentration (atoms/cm$^3$) in the lateral direction in the n-type semiconductor layer 31.

The p-type impurity concentration in the second p-type region 33b is lower than the p-type impurity concentration in the first p-type region 33a. The peak value of the p-type impurity concentration in the second p-type region 33b is smaller than the peak value of the p-type impurity concentration in the first p-type region 33a.

From the viewpoint of suppressing the injection efficiency of holes, the peak value of the p-type impurities in the second p-type region 33b is desirably not more than $5 \times 10^{16}$ (atoms/cm$^3$). Furthermore, the dose quantity of the p-type impurities in the second p-type region 33b is, for example for a high-speed switching type etc., desirably not more than $10^{12}$ (atoms/cm$^2$). An actual dose quantity of the p-type impurities varies according to specific products.

The peak value of the p-type impurity concentration in the first p-type region 33a is $10^{19}$ (atoms/cm$^3$). Furthermore, the length of the second p-type region 33b is shorter than length D3 of the first p-type region 33a (length of the first trench 35). And, the p-type impurity quantity contained in the whole second p-type region 33b is smaller than the p-type impurity quantity contained in the whole first p-type region 33a.

The n-type impurity concentration in the second n-type region 31b is lower than the n-type impurity concentration in the first n-type region 31a. The peak value of the n-type impurity concentration in the second n-type region 31b is smaller than the peak value of the n-type impurity concentration in the first n-type region 31a.

From the viewpoint of suppressing the injection efficiency of electrons, for example, the peak value of the n-type impurities in the second n-type region 31b is desirably not more than $5 \times 10^{16}$ (atoms/cm$^3$). Furthermore, the dose quantity of the n-type impurities in the second n-type region 31b is, for example for a high-speed switching type etc., desirably not more than $10^{12}$ (atoms/cm$^2$). An actual dose quantity of the n-type impurities varies according to specific products.

The peak value of the n-type impurity concentration in the first n-type region 31a is $10^{19}$ (atoms/cm$^3$). Furthermore, the length of the second n-type region 31b is shorter than length D4 of the first n-type region 31a (length of the second trench 36). And, the n-type impurity quantity contained in the whole second n-type region 31b is smaller than the n-type impurity quantity contained in the whole first n-type region 31a.

The n-type impurity concentration in the base layer 32 is lower than the n-type impurity concentration in the first n-type region 31a of the n-type semiconductor layer 31.

When the first electrode 41 is set as a higher potential relative to the second electrode 42 and the forward voltage (forward bias) is applied between the first electrode 41 and the second electrode 42, the state is turned ON. On the contrary, when the second electrode 42 is set as a higher potential relative to the first electrode 41 and the backward voltage (backward bias) is applied between the first electrode 41 and the second electrode 42, the state is turned OFF.

For example, when positive potential is given to the first electrode 41 and 0 V or negative potential is given to the second electrode 42 and the forward voltage is applied between the first electrode 41 and the second electrode 42, holes are injected into the base layer 32 from the p-type semiconductor layer 33, and electrons are injected into the base layer 32 from the n-type semiconductor layer 31, and the forward current flows in the longitudinal direction between the first electrode 41 and the second electrode 42.

The first electrode 41 contacts the first p-type region 33a having a relatively high p-type impurity concentration. Consequently, good ohomic contact between the first electrode 41 and the first p-type region 33a is obtained.

In contrast, the second p-type region 33b on the base layer 32 side has a relatively low p-type impurity concentration, and contains p-type impurities in a small quantity.

Furthermore, the first p-type region 33a is sandwiched by first trenches 35, and in the first trench 35 and at the edge part of the first p-type region 33a, the first electrode 41 is provided. That is, the edge part and the side face of the first p-type region 33a are surrounded by the first electrode 41.

In such a structure, by setting the interval between first trenches 35, or width W3 of the first p-type region 33a to be minute, it is possible to cause the potential of the first electrode 41 to influence the whole in the width direction in the first p-type region 33a. That is, it is possible to cause the potential of the first electrode 41 to also influence the edge part on the base layer 32 side in the first p-type region 33a. Accordingly, no potential difference occurs in the length direction of the first p-type region 33a, or the potential difference in the length direction is very small.

Consequently, in an ON state in which the forward bias is applied, the transfer of holes in the length direction in the first p-type region 33a is regulated, and holes are scarcely injected into the base layer 32 from the first p-type region 33a.

Alternatively, holes injected into the base layer 32 from the first p-type region 33a are very few.

Accordingly, when the state is ON, holes are injected into the base layer 32 from the second p-type region 33b. The second p-type region 33b contains a smaller quantity of p-type impurities as compared with the first p-type region 33a. Consequently, it is possible to lower the injection efficiency of holes into the base layer 32, and to decrease holes remaining in the base layer 32 immediately after turnoff. As the result, it is possible to reduce the backward current at the time of the turnoff, and to reduce switching loss.

Also in the second embodiment, turnoff properties are improved by the control of impurity quantity in the p-type semiconductor layer 33 and the geometric structure obtained by forming the first trench 35, without introducing a lifetime killer into the base layer 32. Accordingly, as compared with the case where the lifetime is controlled by the lifetime killer, the leakage current in an OFF state can be decreased. The leakage current can be reduced, and thus operations at higher temperatures are possible.

When the interval between first trenches 35, or the width W3 of the first p-type region 33a is large, it becomes difficult to cause the potential of the first electrode 41 to influence the whole in the width direction in the first p-type region 33a. Accordingly, the width W3 of the first p-type region 33a is desirably not more than 1 (μm).

The second electrode 42 contacts the first n-type region 31a having a relatively high n-type impurity concentration. Consequently, good ohmic contact of the second electrode 42 with the first n-type region 31a can be obtained.

In contrast, the second n-type region 31b on the base layer 32 side has a relatively low n-type impurity concentration, and contains n-type impurities in a small quantity.

The first n-type region 31a is sandwiched by second trenches 36, and in the second trench 36 and on the first n-type region 31a, the second electrode 42 is provided. That is, the edge part and the side face of the first n-type region 31a are surrounded by the second electrode 42.

In such a structure, by setting the interval between second trench 36, or width W4 of the first n-type region 31a to be minute, it is possible to cause the potential of the second electrode 42 to influence the whole in the width direction in the first n-type region 31a. That is, it is possible to cause the potential of the second electrode 42 to also influence the edge part on the base layer 32 side in the first n-type region 31a. Accordingly, no potential difference occurs in the length direction of the first n-type region 31a, or the potential difference in the length direction is very small.

Consequently, in an ON state in which the forward bias is applied, the transfer of electrons in the length direction in the first n-type region 31a is regulated, and electrons are scarcely injected into the base layer 32 from the first n-type region 31a. Alternatively, electrons injected into the base layer 32 from the first n-type region 31a are very few.

Accordingly, when the state is ON, electrons are injected into the base layer 32 from the second n-type region 31b. The second n-type region 31b contains a smaller quantity of n-type impurities as compared with the first n-type region 31a. Consequently, it is possible to lower the injection efficiency of electrons into the base layer 32, and to decrease electrons remaining in the base layer 32 immediately after turnoff. As the result, it is possible to reduce the backward current at the time of the turnoff, and to reduce switching loss.

Moreover, turnoff properties are improved by the control of impurity quantity in the n-type semiconductor layer 31 and the geometric structure obtained by forming the second trench 36, without introducing a lifetime killer into the base layer 32. Accordingly, as compared with the case where the lifetime is controlled by the lifetime killer, the leakage current in an OFF state can be decreased. Moreover, since the leakage current can be reduced, operations at higher temperatures are possible.

When the interval between second trenches 36, or the width W4 of the first n-type region 31a is large, it becomes difficult to cause the potential of the second electrode 42 to influence the whole in the width direction in the first n-type region 31a. Accordingly, the width W4 of the first n-type region 31a is desirably not more than 1 (μm).

When the backward voltage is applied between the first electrode 41 and the second electrode 42, a depletion layer spreads from the PN-junction of the p-type semiconductor layer 33 and the base layer 32. At this time, since the width W3 of the first p-type region 33a sandwiched by first trenches 35 is narrow, or the ratio of thickness D3 relative to width W3 is large, the depletion layer is pinched off in the first p-type region 33a. Furthermore, since the first p-type region 33a contains impurities in a relatively high concentration, the extension of the depletion layer in the first p-type region 33a is suppressed. Consequently, the depletion layer does not reach the first electrode 41.

Moreover, since the width W4 of the first n-type region 31a sandwiched by second trenches 36 is narrow, or the ratio of thickness D4 relative to width W4 is large, the depletion layer is pinched off in the first n-type region 31a. Furthermore, since the first n-type region 31a contains impurities in a relatively high concentration, the extension of the depletion layer in the first n-type region 31a is suppressed. Consequently, the depletion layer does not reach the second electrode 42. This enables a high breakdown voltage to be realized in an OFF state.

The p-type semiconductor layer 33 can be formed, prior to the formation of the first trench 35, by an ion plantation method using a mask not illustrated. The n-type semiconductor layer 31 can also be formed, prior to the formation of the second trench 36, by an ion plantation method using a mask not illustrated.

In the second embodiment, impurity concentration distribution as shown in FIG. 6A is formed in the lateral direction of the semiconductor layer. This is easy as compared with a case of controlling impurity concentration distribution in the depth direction of the semiconductor layer.

Third Embodiment

Figure 7:
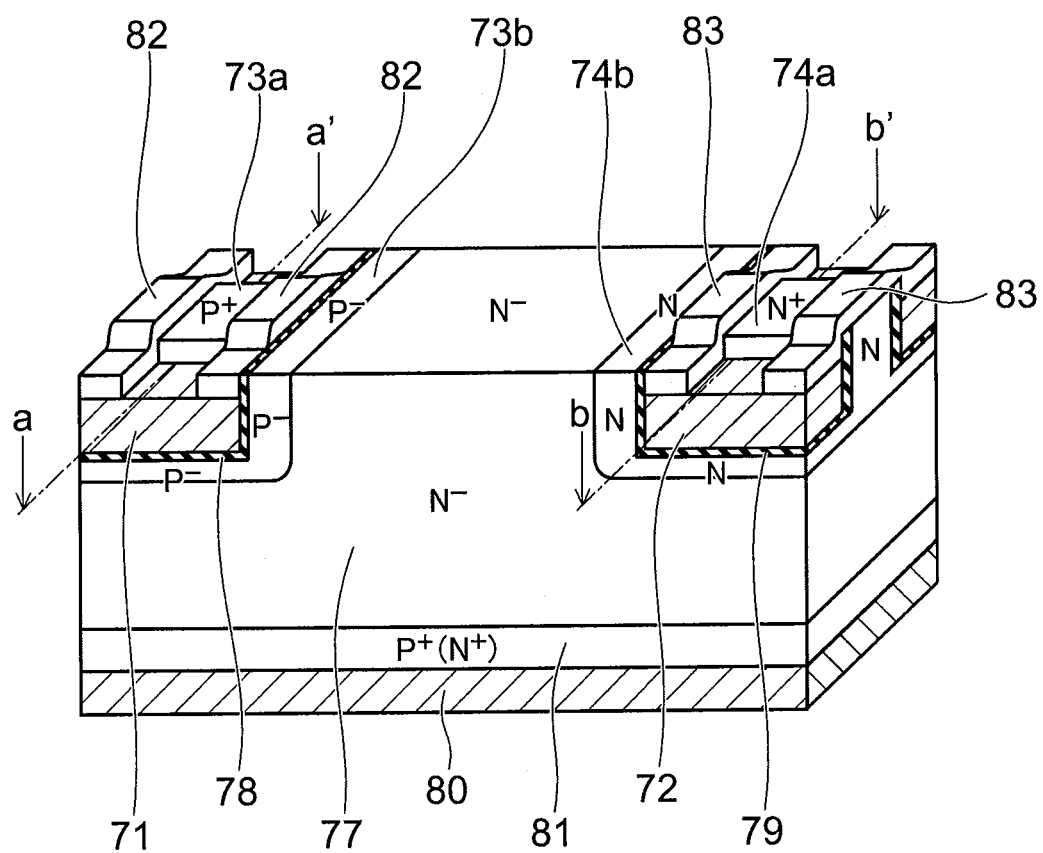
FIG. 7 is a schematic view of a semiconductor device in a third embodiment.

FIG. 7 is a schematic view of the semiconductor device of a third embodiment.

Figures 8A, 8B:
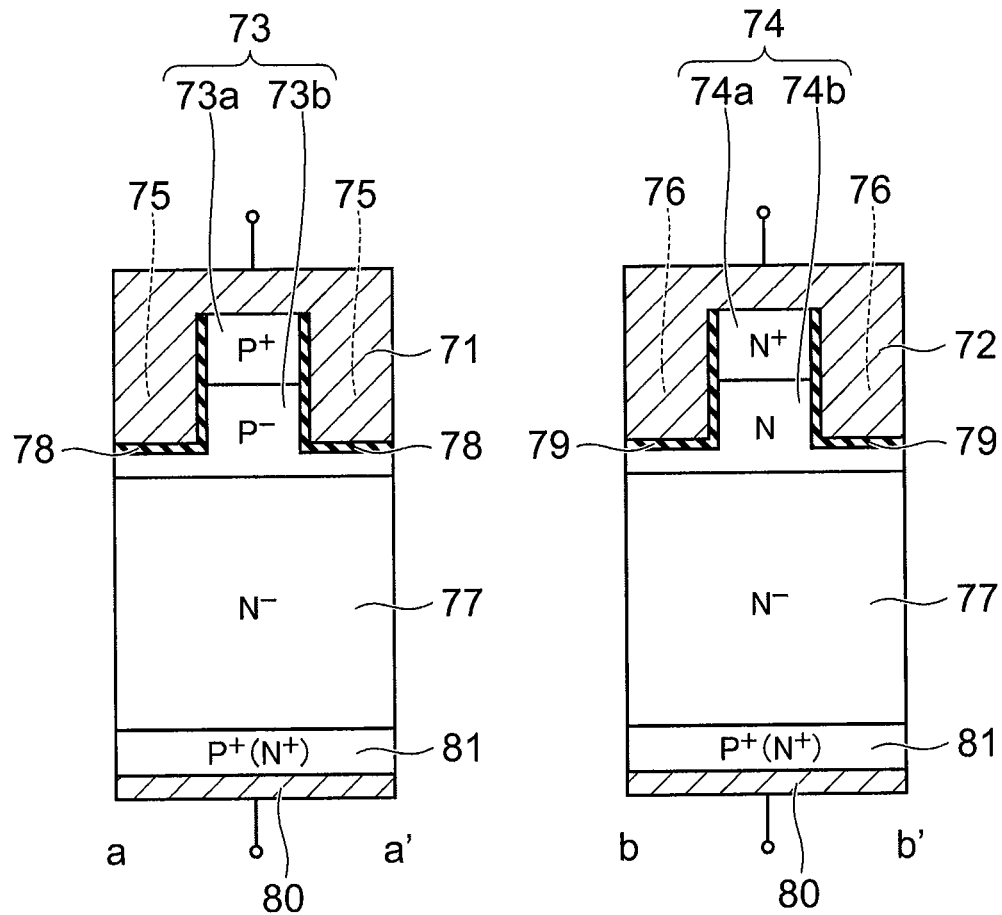
FIG. 8A is an a-a' section view in FIG. 7.
FIG. 8B is an b-b' section view in FIG. 7.

FIG. 8A shows the a-a' cross-section in FIG. 7, and FIG. 8B shows the b-b' cross-section in FIG. 7.

The semiconductor device of the third embodiment is a lateral device, in which a major current path is formed in a lateral direction connecting between a first electrode 71 provided on one major surface side in a semiconductor layer (or substrate) and a second electrode 72 provided on the same major surface side.

On a P$^+$-type or an N$^+$-type substrate 81, an n-type base layer 77 is provided. On the same surface side in the base layer 77, a p-type semiconductor layer 73 and an n-type semiconductor layer 74 are selectively provided with a space.

As shown in FIG. 8A, in the p-type semiconductor layer 73, a plurality of first trenches 75 are formed. The first trench 75 does not reach the base layer 77. That is, the bottom part of the first trench 75 is located on the p-type semiconductor layer 73 side from the PN-junction of the p-type semiconductor layer 73 and the base layer 77. Between the bottom part of the first trench 75 and the base layer 77, the p-type semiconductor layer 73 exists.

On the inner wall (side wall and bottom part) of the first trench 75, a first insulating film 78 is formed. In the first trench 75, the first electrode 71 is provided via the first insulating film 78. The first electrode 71 is buried in the first trench 75, and is also provided on the surface of the p-type semiconductor layer 73. The first electrode 71 is in ohmic contact with the surface of the p-type semiconductor layer 73 to be connected electrically.

As shown in FIG. 8B, in the n-type semiconductor layer 74, a plurality of second trenches 76 are formed. The second trench 76 does not reach the base layer 77. That is, the bottom part of the second trench 76 exists in the n-type semiconductor layer 74. Between the bottom part of the second trench 76 and the base layer 77, the n-type semiconductor layer 74 exists.

On the inner wall (side wall and bottom part) of the second trench 76, a second insulating film 79 is formed. In the second trench 76, the second electrode 72 is provided via the second insulating film 79. The second electrode 72 is buried in the second trench 76, and is also provided on the surface of the n-type semiconductor layer 74. The second electrode 72 is in ohmic contact with the surface of the n-type semiconductor layer 74 to be connected electrically.

The p-type semiconductor layer 73 has a first p-type region 73a and a second p-type region 73b. The first p-type region 73a is sandwiched between adjacent first trenches 75. The second p-type region 73b exists between the first p-type region 73a and the base layer 77, and between the bottom part of the first trench 75 and the base layer 77. Between the second p-type region 73b and the first electrode 71, a first insulating film 78 is provided, and the second p-type region 73b does not contact the first electrode 71.

The n-type semiconductor layer 74 has a first n-type region 74a and a second n-type region 74b. The first n-type region 74a is sandwiched between adjacent second trenches 76. The second n-type region 74b exists between the first n-type region 74a and the base layer 77, and between the bottom part of the second trench 76 and the base layer 77. Between the second n-type region 74b and the second electrode 72, a second insulating film 79 is provided, and the second n-type region 74b does not contact the second electrode 72.

In the same manner as the aforementioned embodiment, the p-type impurity concentration in the second p-type region 73b is lower than the p-type impurity concentration in the first p-type region 73a. The peak value of the p-type impurity concentration in the second p-type region 73b is smaller than the peak value of the p-type impurity concentration in the first p-type region 73a.

From the viewpoint of suppressing the injection efficiency of holes, for example, the peak value of the p-type impurities in the second p-type region 73b is desirably not more than $5 \times 10^{16}$ (atoms/cm$^3$). The dose quantity of the p-type impurities in the second p-type region 73b is, for example for a high-speed switching type etc., desirably not more than $10^{12}$ (atoms/cm$^2$). An actual dose quantity of the p-type impurities varies according to specific products.

The peak value of the p-type impurity concentration in the first p-type region 73a is $10^{19}$ (atoms/cm$^3$). The thickness of the second p-type region 73b is smaller than the depth of the first trench 75. And, the p-type impurity quantity contained in the whole second p-type region 73b is smaller than the p-type impurity quantity contained in the whole first p-type region 73a.

The n-type impurity concentration in the second n-type region 74b is lower than the n-type impurity concentration in the first n-type region 74a. The peak value of the n-type impurity concentration in the second n-type region 74b is smaller than the peak value of the n-type impurity concentration in the first n-type region 74a.

From the viewpoint of suppressing the injection efficiency of electrons, for example, the peak value of the n-type impurities in the second n-type region 74b is desirably not more than $5 \times 10^{16}$ (atoms/cm$^3$). The dose quantity of the n-type impurities in the second n-type region 74b is, for example for a high-speed switching type etc., desirably not more than $10^{12}$ (atoms/cm$^2$). An actual dose quantity of the n-type impurities varies according to specific products.

The peak value of the n-type impurity concentration in the first n-type region 74a is $10^{19}$ (atoms/cm$^3$). The thickness of the second n-type region 74b is smaller than the depth of the second trench 76. The n-type impurity quantity contained in the whole second n-type region 74b is smaller than the n-type impurity quantity contained in the whole first n-type region 74a.

The n-type impurity concentration in the base layer 77 is lower than the n-type impurity concentration in the first n-type region 74a of the n-type semiconductor layer 74.

On the first trench 75, an insulating layer 82 (FIG. 7) is provided so as to sandwich the upper side face of the first p-type region 73a. Similarly, on the second trench 76, an insulating layer 83 (FIG. 7) is provided so as to sandwich the upper side face of the first n-type region 74a.

Furthermore, on the rear face of the substrate 81, a rear face electrode 80 is provided. When the potential of the substrate 81 is fixed, the rear face electrode 80 is set to have 0 V or the same potential as the first electrode 71. Not limited to this, according to circumstances, the rear face electrode 80 may be set to have the same potential as the second electrode 72, or set to other arbitrary potential.

In the semiconductor device of the third embodiment, when the first electrode 71 is set to have a higher potential relative to the second electrode 72 and the forward voltage (forward bias) is applied between the first electrode 71 and the second electrode 72, the state is turned ON. On the contrary, when the second electrode 72 is set to have a higher potential relative to the first electrode 71 and the backward voltage (backward bias) is applied between the first electrode 71 and the second electrode 72, the state is turned OFF.

When the forward bias is applied, holes are injected into the base layer 77 from the p-type semiconductor layer 73 and electrons are injected into the base layer 77 from the n-type semiconductor layer 74, and the forward current flows between the first electrode 71 and the second electrode 72.

The first electrode 71 contacts the first p-type region 73a having a relatively high p-type impurity concentration. Consequently, good ohmic contact of the first electrode 71 with the first p-type region 73a can be obtained.

In contrast, the second p-type region 73b on the base layer 77 side has a relatively low p-type impurity concentration and contains p-type impurities in a small quantity.

Furthermore, the first p-type region 73a is sandwiched by first trenches 75, and the first electrode 71 is provided in the first trench 75 and on the first p-type region 73a. That is, the upper face and the side face of the first p-type region 73a are surrounded by the first electrode 71.

In such a structure, by setting the interval between first trenches 75 to be narrow (setting it to be not more than 1 μm), it is possible to cause the potential of the first electrode 71 to influence the whole in the width direction in the first p-type region 73a. Consequently, no potential difference occurs in the longitudinal direction of the first p-type region 73a, or the potential difference in the longitudinal direction is very small.

Consequently, in an ON state in which the forward bias is applied, the transfer of holes in the longitudinal direction in the first p-type region 73a is regulated, and holes are scarcely injected into the base layer 77 from the first p-type region 73a. Or, very few holes are injected into the base layer 77 from the first p-type region 73a.

Accordingly, in the ON state, holes are injected into the base layer 77 from the second p-type region 73b. The second p-type region 73b contains a smaller quantity of p-type impurities as compared with the first p-type region 73a. Consequently, it is possible to lower the injection efficiency of holes into the base layer 77, and to decrease holes remaining in the base layer 77 immediately after turnoff. As the result, it is possible to reduce the backward current at the time of the turnoff, and to reduce switching loss.

In the third embodiment, too, turnoff properties are improved by the control of impurity quantity in the P-type semiconductor layer 73 and the geometric structure obtained by forming the first trench 75, without introducing a lifetime killer into the base layer 77. Accordingly, as compared with the case where the lifetime is controlled by the lifetime killer, the leakage current in an OFF state can be decreased. The leakage current depends on temperatures, and the leakage current is apt to increase with the rise of temperature. In the third embodiment, since the leakage current can be reduced, operations at higher temperatures become possible.

In contrast, the second electrode 72 contacts the first n-type region 74a having a relatively high n-type impurity concentration. Consequently, good ohmic contact of the second electrode 72 with the first n-type region 74a can be obtained.

The second n-type region 74b on the base layer 77 side has a relatively low n-type impurity concentration, and contains n-type impurities in a small quantity.

Furthermore, the first n-type region 74a is sandwiched by second trenches 76, and the second electrode 72 is provided in the second trench 76 and on the first n-type region 74a. That is, the upper face and the side face of the first n-type region 74a are surrounded by the second electrode 72.

In such a structure, by setting the interval between second trenches 76 to be narrow (setting it to be not more than 1 μm), it is possible to cause the potential of the second electrode 72 influence the whole in the width direction in the first n-type region 74a. Consequently, no potential difference occurs in the longitudinal direction of the first n-type region 74a, or the potential difference in the longitudinal direction is very small.

Consequently, in an ON state in which the forward bias is applied, the transfer of electrons in the longitudinal direction in the first n-type region 74a is regulated, and electrons are scarcely injected into the base layer 77 from the first n-type region 74a. Or, electrons injected into the base layer 77 from the first n-type region 74a are very few.

Accordingly, in the ON state, electrons are injected into the base layer 77 from the second n-type region 74b. The second n-type region 74b contains a smaller quantity of n-type impurities as compared with the first n-type region 74a. Consequently, it is possible to lower the injection efficiency of electrons into the base layer 77, and to decrease electrons remaining in the base layer 77 immediately after turnoff. As the result, it is possible to reduce the backward current at the time of the turnoff, and to reduce switching loss.

Also in the third embodiment, turnoff properties are improved by the control of impurity quantity in the n-type semiconductor layer 74 and the geometric structure obtained by forming the second trench 76, without introducing a lifetime killer into the base layer 77. Accordingly, as compared with the case where the lifetime is controlled by the lifetime killer, the leakage current in an OFF state can be decreased. The leakage current depends on temperatures, and the leakage current is apt to increase with the rise of temperature. In the third embodiment, since the leakage current can be reduced, operations at higher temperatures become possible.

Furthermore, to the structure of the third embodiment, the result of simulation analysis explained with reference to FIGS. 4 and 5 is applied.

Figure 9:
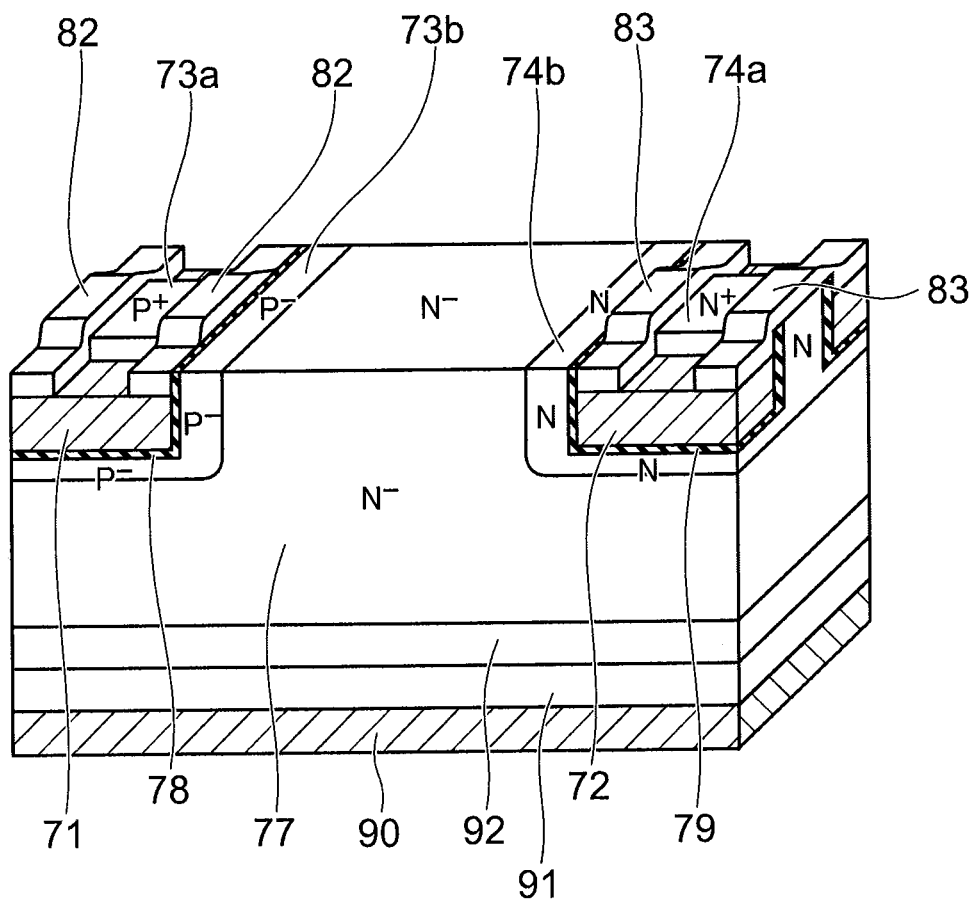
FIG. 9 is a schematic view of another example of the semiconductor device in the third embodiment.

Moreover, as shown in FIG. 9, the embodiment in FIGS. 7 and 8 may be of a so-called SOI (Silicon On Insulator) in which the base layer 77 is provided on a substrate 91 via an insulating layer 92. When the potential of the substrate 91 is fixed, the rear face electrode 90 provided on the rear face of the substrate 91 is set to 0 V or the same potential as the electrode contacting the first p-type region 73a. Not limited to this, according to circumstances, the rear face electrode 90 may be set to the same potential as the electrode contacting the first n-type region 74a, or other arbitrary potential.

Fourth Embodiment

Figure 10A:
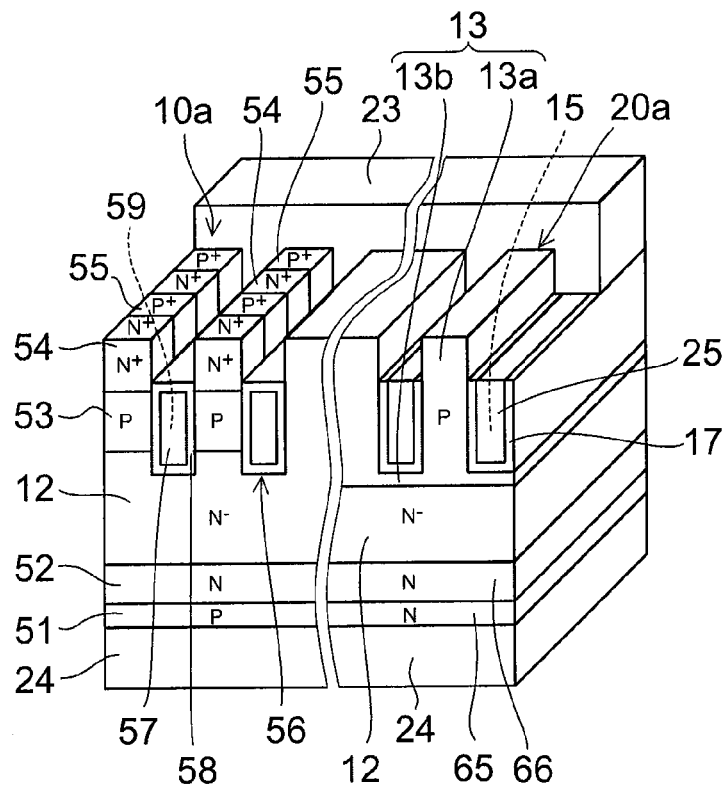
FIGS. 10A and 10B are schematic views of a semiconductor device in a fourth embodiment.

FIG. 10A is a schematic view of the semiconductor device of a fourth embodiment.

The semiconductor device of the fourth embodiment has a transistor cell 10a and a diode cell 20a provided on a common substrate or a semiconductor layer.

The transistor cell 10a and the diode cell 20a have, as devices common to these, the n-type base layer 12, the first electrode 23 and the second electrode 24. The n-type base layer 12 has a first face and a second face on the opposite side, and the first electrode 23 is provided on the first face side and the second electrode 24 is provided on the second face side.

Each of the transistor cell 10a and the diode cell 20a is a vertical device in which a major current path is formed in the longitudinal direction connecting between the first electrode 23 and the second electrode 24. The transistor cell 10a and the diode cell 20a are electrically connected in parallel between the first electrode 23 and the second electrode 24.

The transistor cell 10a and the diode cell 20a are connected, for example, to an inductive load. The transistor cell 10a functions as a switching device turned ON/OFF in accordance with gate potential given to a gate electrode 57. The diode cell 20a functions as a freewheel diode flowing a return current caused by energy accumulated in the inductive load. Alternatively, the diode cell 20a functions as a protection device that causes a surge current to pass.

The transistor cell 10a is, for example, a longitudinal type IGBT (Insulated Gate Bipolar Transistor) of a trench gate structure.

That is, the transistor cell 10a has a p-type semiconductor layer 51 functioning as a collector layer, an n-type semiconductor layer 52, the n-type base layer 12, a p-type base layer 53, an n-type semiconductor region 54 functioning as an emitter region, a p-type contact region 55 and a trench gate 56.

The p-type semiconductor layer 51 is provided on the second electrode 24. The n-type semiconductor layer 52 is provided on the p-type semiconductor layer 51. The n-type base layer 12 is provided on the n-type semiconductor layer 52. The p-type base layer 53 is provided on the n-type base layer 12. The n-type semiconductor region 54 and the p-type contact region 55 are provided selectively on the p-type base layer 53.

The n-type semiconductor region 54 has a higher n-type impurity concentration than the n-type base layer 12. The p-type contact region 55 has a higher p-type impurity concentration than the p-type base layer 53. The n-type semiconductor region 54 and the p-type contact region 55 are, for example, in the plan view, laid out alternately in the direction in which the trench gate 56 extends.

On the upper face and side face of the n-type semiconductor region 54, the first electrode 23 is provided, and the upper face and the side face of the n-type semiconductor region 54 are in ohmic contact with the first electrode 23. On the upper face and the side face of the p-type contact region 55, too, the first electrode 23 is provided, and the upper face and the side face of the p-type contact region 55 are in ohmic contact with the first electrode 23.

The trench gate 56 has a gate trench 59, a gate insulating film 58, and a gate electrode 57.

The gate trench 59 penetrates the p-type base layer 53 under a part between the adjacent n-type semiconductor region 54 and n-type semiconductor region 54 to thereby reach the n-type base layer 12. On the side wall and the bottom part of the gate trench 59, the gate insulating film 58 is provided. On the inside of the gate insulating film 58 in the gate trench 59, the gate electrode 57 is provided. The gate electrode 57 faces the p-type base layer 53 via the gate insulating film 58.

On the gate electrode 57, the gate insulating film 58 is provided, and the gate electrode 57 does not contact the first electrode 23. A part of the gate electrode 57 is led upward and connected with a gate wiring not shown.

In a state where, relatively, a low potential is applied to the first electrode 23 and a high potential is applied to the second electrode 24, when an intended gate potential is applied to the gate electrode 57, an inversion layer (channel) is formed in the p-type base layer 53 near the interface with the gate insulating film 58.

Consequently, electrons are injected into the n-type base layer 12 from the n-type semiconductor region (emitter region) 54 via the channel, and the transistor cell 10a is turned to ON. At this time, furthermore, holes are injected into the n-type base layer 12 from the p-type semiconductor layer 51. In IGBT, in an ON state, holes are injected into the n-type base layer 12 from the p-type semiconductor layer (collector layer) 51 to thereby generate conductivity modulation and reduce the resistance of the n-type base layer 12.

Next, the diode cell 20a will be explained.

The diode cell 20a has a diode structure provided with an n-type semiconductor layer 65, an n-type semiconductor layer 66, the n-type base layer 12 and the p-type semiconductor layer 13, between the first electrode 23 and the second electrode 24.

The n-type semiconductor layer 65 is provided on the second electrode 24. The n-type semiconductor layer 66 is provided on the n-type semiconductor layer 65. The n-type base layer 12 is provided on the n-type semiconductor layer 66. The p-type semiconductor layer 13 is provided on the n-type base layer 12.

In the p-type semiconductor layer 13, a plurality of trenches 15 are formed. The trench 15 extends from the surface of the p-type semiconductor layer 13 toward the n-type base layer 12 side, but does not reach the n-type base layer 12. That is, the bottom part of the trench 15 is located on the p-type semiconductor layer 13 side from the PN-junction of the p-type semiconductor layer 13 and the n-type base layer 12. Between the bottom part of the trench 15 and the n-type base layer 12, the p-type semiconductor layer 13 exists.

A plurality of trenches 15 of the diode cell 20a and a plurality of gate trenches 59 of the transistor cell 10a can be formed simultaneously by etching using the same mask. Each of the width of the trench 15, the pitch of a plurality of trenches 15, the width of the gate trench 59, and the pitch of a plurality of gate trenches 59 can be formed arbitrarily by the design of the mask pattern.

On the inner wall (side wall and bottom part) of the trench 15, the insulating film 17 is formed. In the trench 15, an buried electrode 25 is provided via the insulating film 17.

On the buried electrode 25 and on the surface of the p-type semiconductor layer 13, the first electrode 23 is provided. The first electrode 23 contacts the buried electrode 25. Alternatively, a part of the first electrode 23 may be provided in the trench 15 as the buried electrode 25. That is, the first electrode 23 and the buried electrode 25 may be formed as one body from the same material. Furthermore, the buried electrode 25 and the first electrode 23 are joined electrically. The first electrode 23 is in ohmic contact with the upper face and the side face of the p-type semiconductor layer 13.

The p-type semiconductor layer 13 has the first p-type region 13a and the second p-type region 13b. The first p-type region 13a has a part sandwiched between first trenches 15 adjacent in a lateral direction, and a part contacting the first electrode 23.

The second p-type region 13b exists between the first p-type region 13a and the n-type base layer 12, and between the bottom part of the trench 15 and the n-type base layer 12. Between the second p-type region 13b and the buried electrode 25, the insulating film 17 is provided. The second p-type region 13b does not contact the buried electrode 25 and the first electrode 23.

The p-type impurity concentration in the second p-type region 13b is lower than the p-type impurity concentration in the first p-type region 13a. The peak value of the p-type impurity concentration in the second p-type region 13b is smaller than the peak value of the p-type impurity concentration in the first p-type region 13a.

From the viewpoint of suppressing the injection efficiency of holes, for example, the peak value of the p-type impurities in the second p-type region 13b is desirably not more than $5 \times 10^{16}$ (atoms/cm$^3$). The dose quantity of the p-type impurities in the second p-type region 13b is, for example for a high-speed switching type etc., desirably not more than $10^{12}$ (atoms/cm$^2$). An actual dose quantity of the p-type impurities varies according to specific products.

The peak value of the p-type impurity concentration in the first p-type region 13a is $10^{19}$ (atoms/cm$^3$). The thickness of the second p-type region 13b is smaller than the thickness of the first p-type region 13a (depth of the first trench 15). And, the p-type impurity quantity contained in the whole second p-type region 13b is smaller than the p-type impurity quantity contained in the whole first p-type region 13a.

When the first electrode 23 is set to have a higher potential relative to the second electrode 24 and the forward voltage (forward bias) is applied between the first electrode 23 and the second electrode 24, the diode cell 20a is turned ON. On the contrary, when the second electrode 24 is set to have a higher potential relative to the first electrode 23 and the backward voltage (backward bias) is applied between the first electrode 23 and the second electrode 24, the cell is turned OFF.

The first electrode 23 contacts the first p-type region 13a having a relatively high p-type impurity concentration. Consequently, good ohmic contact of the first electrode 23 with the first p-type region 13a can be obtained.

In contrast, the second p-type region 13b on the base layer 12 side has a relatively low p-type impurity concentration, and contains p-type impurities in a small quantity.

The first p-type region 13a is sandwiched by trenches 15, and the buried electrode 25, to which the same potential as the potential of the first electrode 23 is given, is provided. That is, the upper face and the side face of the first p-type region 13a are surrounded by electrodes to which the same potential is given.

In such a structure, by setting the interval between first trenches 15, or the width of the first p-type region 13a to be minute, it is possible to cause the potential of the first electrode 23 to influence the whole in the width direction in the first p-type region 13a. That is, it is possible to cause the potential of the first electrode 23 to influence the edge part on the n-type base layer 12 side, too, in the first p-type region 13a. Accordingly, no potential difference occurs in the longitudinal direction of the first p-type region 13a, or the potential difference in the longitudinal direction is very small.

Consequently, in the ON state in which the forward bias is applied to the diode cell 20a, the transfer of holes in the longitudinal direction in the first p-type region 13a is regulated, and holes are scarcely injected into the n-type base layer 12 from the first p-type region 13a. Alternatively, holes injected into the n-type base layer 12 from the first p-type region 13a are very few.

Accordingly, when the diode cell 20a is in the ON state, holes are injected into the n-type base layer 12 from the second p-type region 13b. The second p-type region 13b contains a smaller quantity of p-type impurities as compared with the first p-type region 13a. Consequently, it is possible to lower the injection efficiency of holes into the n-type base layer 12, and to decrease holes remaining in the n-type base layer 12 immediately after turnoff of the diode cell 20a. As the result, it is possible to reduce the backward current at the time of the turnoff, and to reduce switching loss.

That is, in the diode cell 20a of the fourth embodiment, turnoff properties are improved by the control of impurity quantity in the p-type semiconductor layer 13 and the geometric structure obtained by forming the trench 15, without introducing a lifetime killer into the n-type base layer 12. Accordingly, as compared with the case where the lifetime is controlled by the lifetime killer, the leakage current in an OFF state can be decreased. The leakage current depends on temperatures, and the leakage current is apt to increase with the rise of temperature. In the fourth embodiment, since the leakage current can be reduced, operations at higher temperatures are possible.

When the interval between trenches 15, or the width of the first p-type region 13a is large, it becomes difficult to cause the potential of the first electrode 23 to influence the whole in the width direction in the first p-type region 13a. Accordingly, the width of the first p-type region 13a is desirably not more than 1 (μm).

Moreover, by setting the thickness of the n-type semiconductor layer 65 provided on an cathode side (second electrode 24 side) in the diode cell 20a to be thin, holes pass through the n-type semiconductor layer 65, and the injection of electrons can be suppressed. That is, the injection of electrons into the n-type base layer 12 from the cathode side can be made low, the backward current at the time of the turnoff can be reduced, and switching loss can be reduced.

Figure 10B:
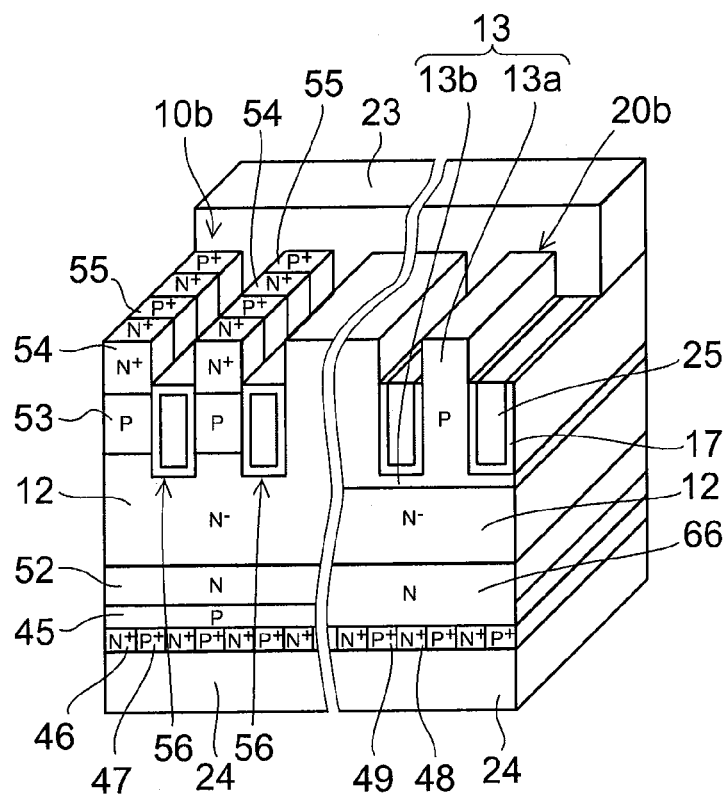

Next, FIG. 10B shows a modification of the semiconductor device of the fourth embodiment.

The semiconductor device also has a transistor cell 10b and a diode cell 20b formed on a common substrate and connected in parallel between the first electrode 23 and the second electrode 24.

The transistor cell 10b is different from the aforementioned transistor cell 10a in a structure on the collector side (second electrode 24 side).

That is, in the transistor cell 10b, on the second electrode 24, a P$^+$-type semiconductor region 47 and an N$^+$-type semiconductor region 46 are provided. The P$^+$-type semiconductor region 47 and the N$^+$-type semiconductor region 46 are laid out alternately in a lateral direction. On these P$^+$-type semiconductor region 47 and N$^+$-type semiconductor region 46, a p-type semiconductor layer 45 is provided.

The P$^+$-type semiconductor region 47 has a higher p-type impurity concentration than the p-type semiconductor layer 45, and functions as a contact region in ohmic contact with the second electrode 24.

The N$^+$-type semiconductor region 46 is provided on the collector side, and thus the area of hole injection is reduced and the hole injection efficiency into the n-type base layer 12 can be made low.

The diode cell 20b is also different from the aforementioned diode cell 20a in a structure on the cathode side (second electrode 24 side).

That is, in the diode cell 20b, on the second electrode 24, a P$^+$-type semiconductor region 49 and an N$^+$-type semiconductor region 48 are provided. The P$^+$-type semiconductor region 49 and the N$^+$-type semiconductor region 48 are laid out alternately in a lateral direction. On these P$^+$-type semiconductor region 49 and N$^+$-type semiconductor region 48, an n-type semiconductor layer 66 is provided.

The N$^+$-type semiconductor region 48 has a higher n-type impurity concentration than the n-type semiconductor layer 66, and functions as a contact region in ohmic contact with the second electrode 24.

The P$^+$-type semiconductor region 49 is provided on the cathode side, and thus the area of electron injection is reduced and the electron injection efficiency into the n-type base layer 12 can be made low.

Figure 11A:
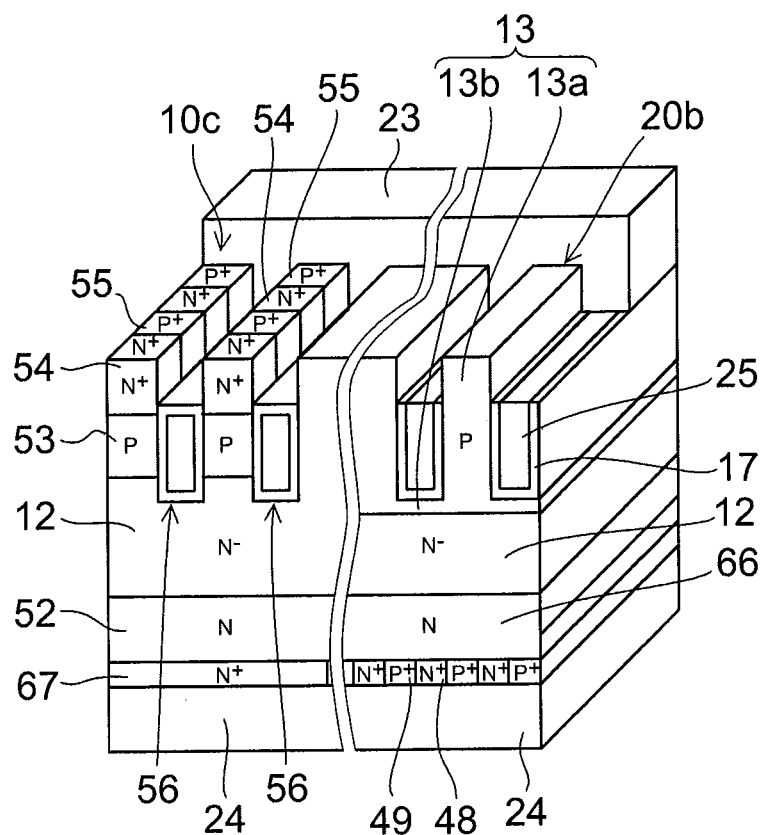
FIGS. 11A and 11B are schematic views of another example of the semiconductor device in the fourth embodiment.

Next, FIG. 11A shows another modification of the semiconductor device of the fourth embodiment.

The semiconductor device also has a transistor cell 10c and a diode cell 20b formed on a common substrate and connected in parallel between the first electrode 23 and the second electrode 24.

The transistor cell 10c has a metal-oxide-semiconductor field effect transistor (MOSFET) structure, in which p-type semiconductor layer (collector layer) 51 in the aforementioned transistor cell 10a is replaced with an n-type semiconductor layer (drain layer) 67.

Figure 11B:
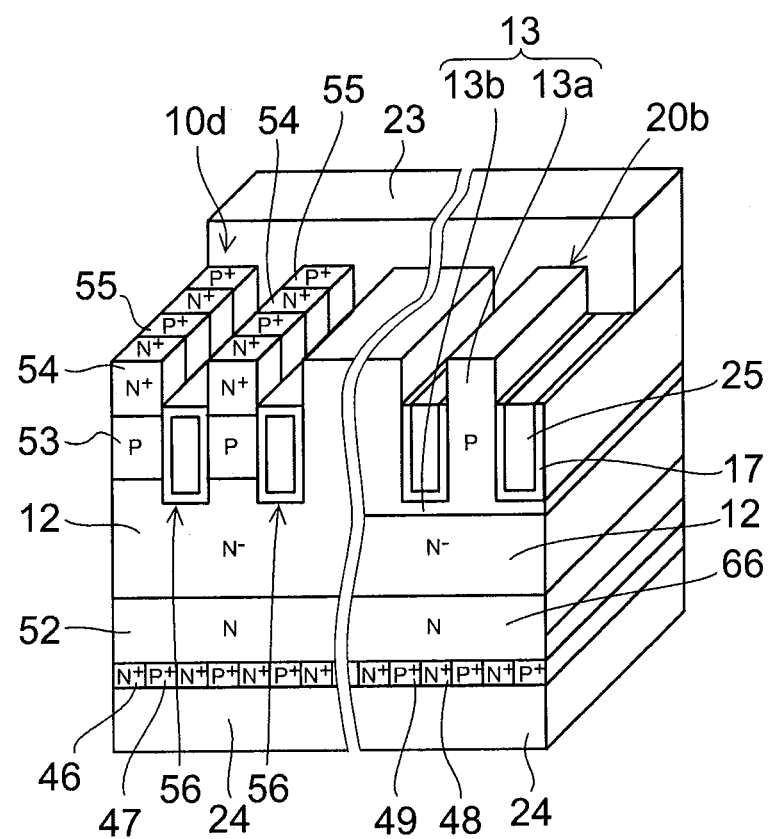

Next, FIG. 11B shows an additional, other modification of the semiconductor device of the fourth embodiment.

The semiconductor device also has a transistor cell 10d and the diode cell 20b formed on a common substrate and connected in parallel between the first electrode 23 and the second electrode 24.

The transistor cell 10d also has a (MOSFET) structure. On the drain side (second electrode 24 side) of the transistor cell 10, in the same manner as the transistor cell 10b shown in FIG. 10B, the P$^+$-type semiconductor region 47 and the N$^+$-type semiconductor region 46 laid out alternately in lateral direction are provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a base layer;
a second conductivity type semiconductor layer provided on a first side of the base layer;
a first insulating film provided on an inner wall of a plurality of first trenches that each extend from a first surface of the second conductivity type semiconductor layer that is substantially parallel to the base layer toward the base layer, but do not reach the base layer; and a first electrode provided in each first trench on the first insulating film and electrically contacting the second conductivity type semiconductor layer at the first surface and at a first side surface of the second conductivity type semiconductor layer that intersects the first surface, the second conductivity type semiconductor layer including:

a first second conductivity type region provided between the first trenches; and a second second conductivity type region provided between the first second conductivity type region and the base layer and between a bottom part of each first trench and the base layer, the second second conductivity type region having a quantity of second conductivity type impurities that is less than a quantity of second conductivity type impurities in the first second conductivity type region.

2. The device according to claim 1, further comprising:

a first conductivity type semiconductor layer provided on a second side of the base layer that is opposite to the first side in the base layer;

a second insulating film provided on an inner wall of a plurality of second trenches that each extend from a second surface of the first conductivity type semiconductor layer that is substantially parallel to the base layer toward the base layer, but do not reach the base layer; and a second electrode provided in each second trench on the second insulating film and electrically contacting the first conductivity type semiconductor layer at the second surface and at a second side surface of the second conductivity type semiconductor layer that intersects the second surface, the first conductivity type semiconductor layer including:

a first first conductivity type region between by the second trenches; and a second first conductivity type region between the first first conductivity type region and the base layer and between a bottom part of each second trench and the base layer, the second first conductivity type region having a quantity of first conductivity type impurities that is less than a quantity of first conductivity type impurities in the first first conductivity type region.

3. The device according to claim 1, further comprising:

a first conductivity type semiconductor layer provided on a face side provided with the second conductivity type semiconductor layer in the base layer, spacing from the second conductivity type semiconductor layer;

a second insulating film provided on an inner wall of a plurality of second trenches extending from a surface of the first conductivity type semiconductor layer toward the base layer side, but not reaching the base layer; and a second electrode provided in the second trench via the second insulating film, and provided in contact with a surface of the second conductivity type semiconductor layer;

the first conductivity type semiconductor layer including:

a first first conductivity type region provided between by the second trenches; and a second first conductivity type region provided between the first first conductivity type region and the base layer, and between a bottom part of the second trench and the base layer, the second first conductivity type region being smaller in a quantity of first conductivity type impurities than the first first conductivity type region.

4. The device according to claim 1, wherein the second second conductivity type region is lower in concentration of second conductivity type impurities than the first second conductivity type region.

5. The device according to claim 2, wherein the second first conductivity type region is lower in concentration of first conductivity type impurities than the first first conductivity type region.

6. The device according to claim 1, wherein the thickness of the second second conductivity type region is smaller than the depth of the first trench.

7. The device according to claim 2, wherein the thickness of the second first conductivity type region is smaller than the depth of the second trench.

8. The device according to claim 1, wherein:

the first second conductivity type region contacts the first electrode; and the first insulating film is provided between the second second conductivity type region and the first electrode.

9. The device according to claim 2, wherein:

the first first conductivity type region contacts the second electrode; and the second insulating film is provided between the second first conductivity type region and the second electrode.

10. The device according to claim 1, wherein the width of the first second conductivity type region is not more than 1 (μm).

11. The device according to claim 2, wherein the width of the first first conductivity type region is not more than 1 (μm).

* * * * *